United States Patent
Aoya

(10) Patent No.: US 8,434,664 B2
(45) Date of Patent: May 7, 2013

(54) MICRO-BALL LOADING DEVICE AND LOADING METHOD

(75) Inventor: Kengo Aoya, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 1014 days.

(21) Appl. No.: 12/025,400

(22) Filed: Feb. 4, 2008

(65) Prior Publication Data

US 2009/0001132 A1 Jan. 1, 2009

(30) Foreign Application Priority Data

Feb. 5, 2007 (JP) .................................. 2007-025596

(51) Int. Cl.
*B23K 20/03* (2006.01)

(52) U.S. Cl.
USPC .......... 228/173.1; 228/39; 228/201; 228/246; 438/626

(58) Field of Classification Search .............. 228/173.1, 228/39, 201, 246; 438/626
See application file for complete search history.

(56) References Cited

U.S. PATENT DOCUMENTS

| | | | |
|---|---|---|---|
| 5,205,896 A * | 4/1993 | Brown et al. | 156/297 |
| 5,872,051 A | 2/1999 | Fallon et al. | |
| 5,959,346 A | 9/1999 | Ochiai | |
| 6,142,361 A | 11/2000 | Downes, Jr. et al. | |
| 6,325,272 B1 | 12/2001 | May et al. | |
| 6,641,030 B1 | 11/2003 | Freeman et al. | |
| 6,905,059 B2 | 6/2005 | Shafie | |
| 2002/0058406 A1 | 5/2002 | Mukuno et al. | |
| 2004/0124230 A1 | 7/2004 | Hertz et al. | |
| 2006/0086777 A1 * | 4/2006 | Itoh et al. | 228/253 |

FOREIGN PATENT DOCUMENTS

| | | |
|---|---|---|
| JP | 07-139049 | 12/1996 |
| JP | 2000-154813 | 11/2001 |
| JP | 2003-117077 | 11/2004 |
| JP | 2004-327536 | 11/2004 |

* cited by examiner

*Primary Examiner* — Erin Saad
(74) *Attorney, Agent, or Firm* — Steven A. Shaw; W. James Brady; Frederick J. Telecky, Jr.

(57) ABSTRACT

A device for loading electro-conductive ball onto the terminal regions of a substrate more correctly and reliably is disclosed. Micro-ball loading device (200) may have the following parts: backing plate (220) supporting substrate (100) such that plural terminal regions (108) formed on one surface of substrate (100) are free, transfer mask (210), which contains a metal mask and has plural through-holes (216) formed corresponding to plural terminal regions (108) of the substrate, fixing block (230) onto which end portions (210a) of the transfer mask are fixed such that transfer mask (210) faces one surface of the substrate, and magnet part (240), which attaches transfer mask (210) by magnetic force to the side of backing plate (220); for magnet part (240), the attachment force to the center portion of the substrate is less than that of the peripheral edge portion.

9 Claims, 7 Drawing Sheets

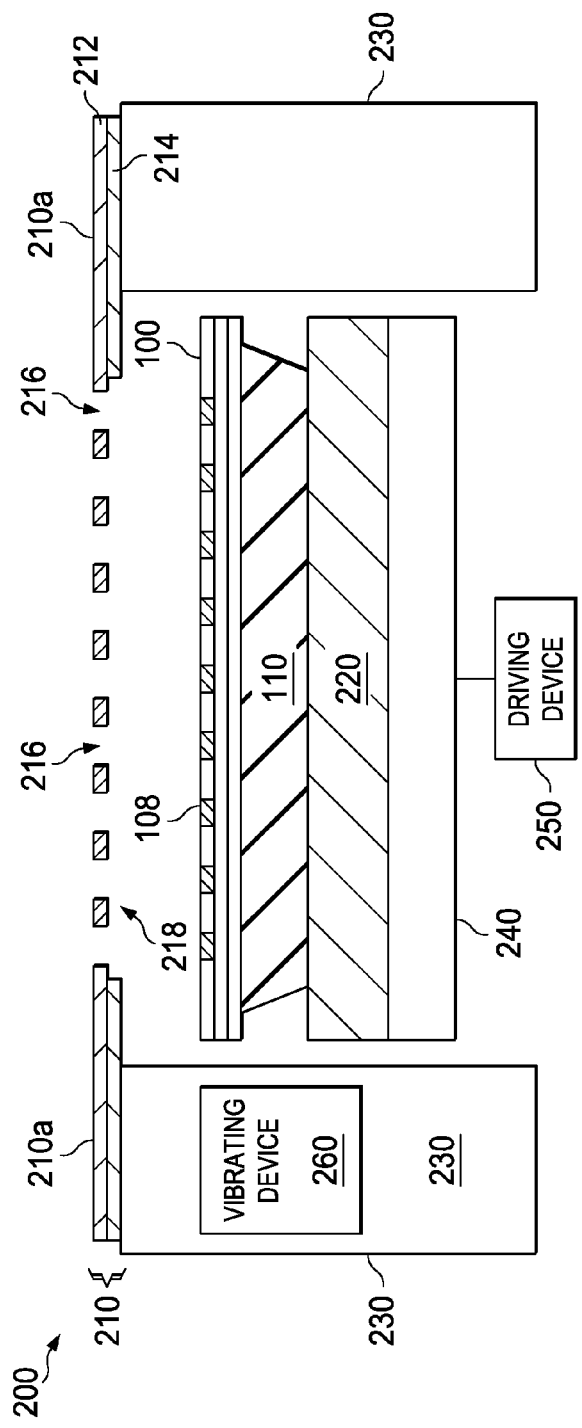
FIG. 6
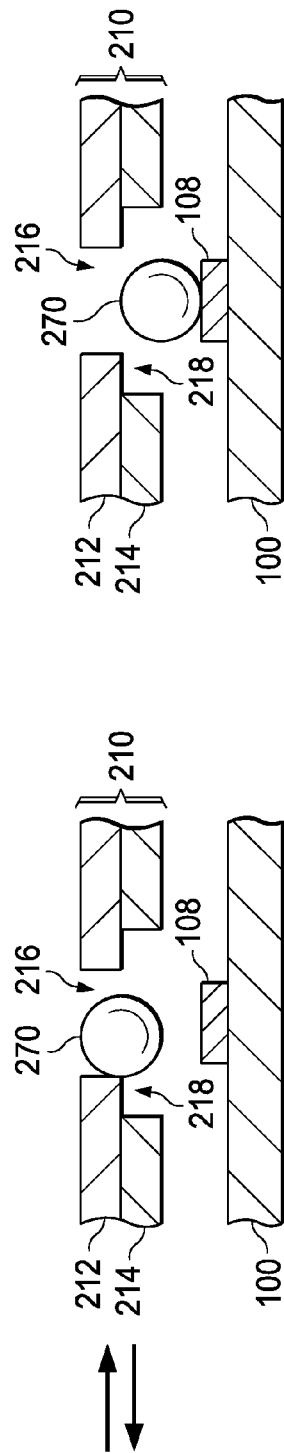
FIG. 7a
FIG. 7b

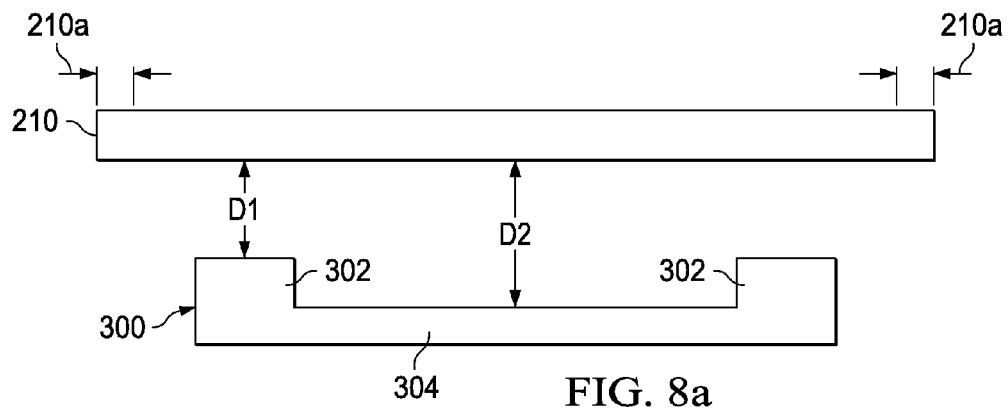
FIG. 8a
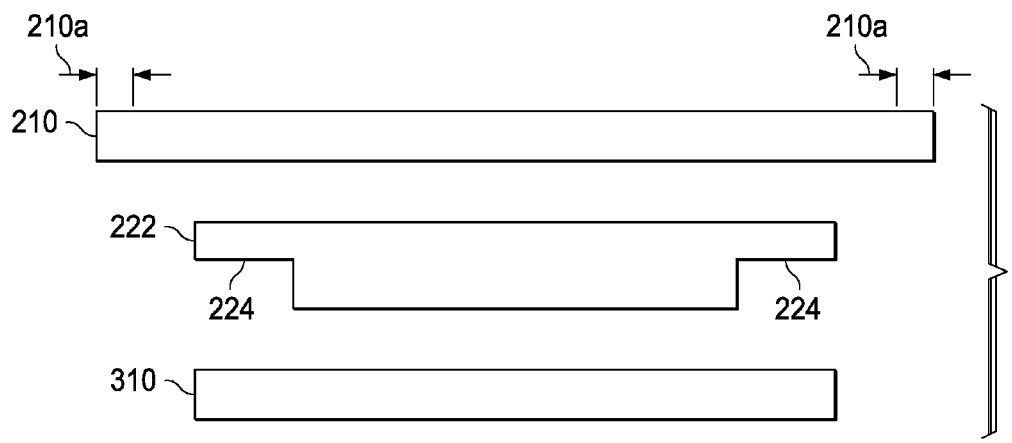
FIG. 8b
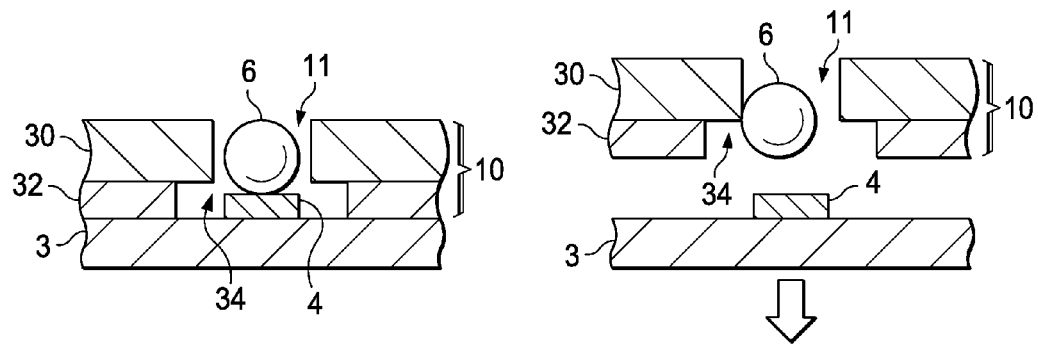
FIG. 11a
FIG. 11b

US 8,434,664 B2

MICRO-BALL LOADING DEVICE AND LOADING METHOD

FIELD OF THE INVENTION

The present invention pertains to a type of micro-ball mounted for loading micro-balls on a semiconductor device of a BGA, CSP package or other surface-mount type of semiconductor device. In particular, the present invention pertains to a method for loading micro-balls on the terminal regions of a substrate using a transfer mask.

BACKGROUND OF THE INVENTION

With the popularization of cell phones, portable computers and other small size electronic devices, there is a need to develop smaller and thinner semiconductor devices to be installed in them. In order to meet this need, BGA packages and CSP packages have been developed that have been put in practical application.

The BGA packages and CSP packages are semiconductor devices for surface mounting. Micro-balls for external connecting terminals are loaded onto one surface of the substrate of the package and are connected there. Several methods may be adopted to load the micro-balls. According to one method, a suction holding head is used. According to another method, a transfer mask is used.

According to the aforementioned method, as shown in FIG. 9(a), substrate (3) with semiconductor chip (1) encapsulated with resin (2) on it is loaded on a stage. Flux or solder paste is placed on terminal regions (4) (electrode lands) of substrate (3). Suction holding head (5) has suction and holding holes (7) for vacuum suction and holding micro-balls (6) (solder balls). While micro-balls (6) are gripped by suction and held, suction holding head (5) is driven to move towards substrate (3), and suction holding head (5) presses micro-balls (6) so that micro-balls (6) are loaded onto terminal regions (4), respectively. This method of loading micro-balls, for example, is disclosed in Patent Reference 1 and Patent Reference 2.

According to the latter method, as shown in FIG. 9(b), transfer mask (10) is arranged facing substrate (3). Through-holes (11) formed in the transfer mask (10) match the pattern of terminal regions (4) on substrate (3). As a result, micro-balls (6) fed onto transfer mask (10) fall through through-holes (11) and are loaded onto terminal regions (4). Then reflow is used to join micro-balls (6) and terminal regions (4) to each other with metal, forming the bump electrodes for external connection of the BGA package or CSP package. This method of loading micro-balls is described, for example, in Patent Reference 3.

Patent Reference 1: Japanese Kokai Patent Application No. 2001-332899
Patent Reference 2: Japanese Kokai Patent Application No. Hei 8[1996]-335771
Patent Reference 3: Japanese Kokai Patent Application No. 2004-327536

The micro-ball loading device using the transfer mask described above, has the following problems. As shown in FIG. 10(a), substrate (3) has resin (2) that is supported on backing plate (20), and transfer mask (10) is fixed at its end portion (10a) to a fixing table, not shown in the figure, so that transfer mask (10) and substrate (3) are arranged facing each other. Magnet (22) is arranged on the lower side of backing plate (20), and transfer mask (10) containing the metal mask is held onto backing plate (20) by the magnetic force of magnet (22), so that transfer mask (10) closely contacts substrate (3). In this state, the micro-balls (6) fall via through-holes (11) onto terminal regions (4).

After the loading of micro-balls (6), as shown in FIG. 10(b), backing plate (20) and magnet (22) are lowered, so that substrate (3) is released from transfer mask (10). In this case, the magnetic force of magnet (22) bends the central portion (10b) of transfer mask 10 more than end portions (10a) to form a concave shape, and release of transfer mask (10) is delayed more at central portion. When transfer mask (10) is bent, the deviation in position of through-holes (111) of transfer mask (10) in the vertical direction causes the positions of micro-balls (6) loaded on the substrate to also deviate from through-holes (11), and this is undesirable.

As shown in FIG. 11(a), transfer mask (10) contains metal mask (30) and resin layer (32) formed on its lower layer. Through-holes (11) in metal mask (30) are formed with a diameter slightly larger than that of micro-balls (6), and openings (34) are formed in resin layer (32) larger than the diameter of through-holes (11). After micro-balls (6) are loaded onto terminal regions (4) of substrate (3), transfer mask (10) is bent when substrate (3) is released from transfer mask (10), as explained above, and the precision of through-holes (11) deteriorates, so that as shown in FIG. 11(b), micro-balls (6) contact the side surface of through-holes (11) and stick there, so that micro-balls (6) cannot fall reliably onto terminal regions (4). This is undesirable.

Deviation in the positions of micro-balls and poor loading cause deterioration and defects of the semiconductor device. As a result, the yield falls and the manufacturing cost rises.

The purpose of the present invention is to solve the aforementioned problems of the prior art by providing a loading device and loading method for electroconductive balls characterized by the fact that the electroconductive balls can be loaded correctly and reliably on the terminal regions of the substrate.

Another purpose of the present invention is to provide a loading device and a loading method for electroconductive balls characterized by the fact that it can increase the yield of BGA packages or CSP packages or other surface mount semiconductor devices, and can lower their manufacturing costs.

SUMMARY OF THE INVENTION

The present invention provides a type of loading device characterized by the fact that the loading device that loads electroconductive balls onto plural terminal regions formed on one surface of a substrate has the following parts: a carrying member that carries the substrate such that one surface of the substrate is free; a mask, which contains a metal member and has plural through-holes formed in the metal member corresponding to plural terminal regions of the substrate; a fixing means that fixes the end portion of the mask such that the mask faces a surface of the substrate; and an attaching means, which is arranged on the side of the carrying member opposite to the side where the substrate is carried, and which serves to attach the mask on the side of the carrying member by means of a magnetic force, with the attachment force of the mask at the central portion of the substrate being lower than that at the peripheral edge portion of the substrate.

The following scheme is preferred: the attaching means has a first magnet part corresponding to the peripheral edge portion of the substrate, and a second magnet part corresponding to the central portion of the substrate, with the magnetic force of the second magnet part being smaller than that of the first magnet part. For example, the first magnet part and the second magnet part may be made of permanent magnets with different magnetic forces.

For the loading device, the attaching means may comprise a magnet with adjustable thickness such that the distance to the mask at the peripheral edge portion of the substrate is smaller than that at the central portion of the substrate, or the attaching means may have a carrying member appropriately constituted such that its thickness at the peripheral edge portion of the substrate is smaller than that at the central portion of the substrate, and a magnet is arranged near the carrying member.

The present invention also provides a type of electroconductive ball manufacturing device characterized by the fact that the loading device that loads electroconductive balls onto plural terminal regions formed on one surface of a substrate has the following parts: a carrying member that carries the substrate such that one surface of the substrate is free; a mask, which has plural through-holes formed in it corresponding to plural terminal regions of the substrate; a fixing means that fixes the end portions of the mask such that the mask faces a surface of the substrate; a moving means, which moves the carrying member towards/away from the mask; and a vibrating means, which vibrates the mask after the electroconductive balls have been loaded onto the terminal regions via the through-holes in the mask.

It is preferred that the vibrating means apply at least one impact in the horizontal direction of the mask. Also, it is preferred that the vibrating means apply vibration to the mask when the end region of the substrate is away from the mask by a prescribed distance.

The present invention also provides a loading method characterized by the fact that the method for loading electroconductive balls onto plural terminal regions formed on one surface of a substrate has the following process steps: the substrate is arranged such that it is opposite to a mask having plural through-holes formed in it corresponding to the plural terminal regions of the substrate; electroconductive balls are allowed to fall through the plural through-holes onto the substrate and are loaded onto the terminal regions corresponding to the electroconductive balls; and the mask is vibrated when the substrate is away from the mask by a prescribed distance.

BRIEF DESCRIPTION OF THE DRAWINGS

FIG. 2.

FIG. 5.

FIG. 6 is a cross section illustrating the state when the substrate is supported on the micro-ball loading device.

FIG. 7: FIG. 7(a) is a diagram illustrating the state when vibration is applied to the transfer mask. FIG. 7(b) is a diagram illustrating the state in which the micro-balls have been so that the vibration causes them shaken to fall.

FIG. 8(a) and FIG. 8(b) depict examples of the magnet part of the present application example.

FIG. 9 illustrates the method of loading micro-balls in the prior art.

FIG. 11 is a diagram illustrating the problems with the transfer mask in the prior art.

REFERENCE NUMERALS AND SYMBOLS AS SHOWN IN THE DRAWINGS

In the figures, 100 represents a substrate, 102 represents a semiconductor chip, 104A, 104B, 104C, 104D represent blocks of semiconductor chips, 106 represents a bonding wire, 108 represents a terminal region, 110 represents an encapsulating resin, 200 represents a micro-ball loading device, 210 represents a transfer mask, 212 represents a first-layer mask, 214 represents a second-layer mask, 216 represents a through-hole, 218 represents an opening, 220 represents a backing plate, 230 represents a fixing block, 240 represents a magnet part, 242, 244 represents a magnet region, 250 represents a driving device, 260 represents a vibrating device, 270 represents a micro-ball, 300, 310 represents a permanent magnet, 302, 304 represents a magnet region.

DESCRIPTION OF THE EMBODIMENTS

According to the present invention, when the substrate is released from the mask, the attachment force of the mask at the central part of the substrate is smaller that that at the peripheral edges of the substrate. Consequently, bending of the central portion of the mask can be prevented, and deviation in the position of electroconductive balls carried on the substrate by the mask can be prevented. In addition, when the substrate is released from the mask, vibration is applied to the mask, so that the electroconductive balls left in the through-holes in the mask can be shaken down onto the terminal regions of the substrate. As a result, it is possible to improve the semiconductor device yield, and it is possible to reduce the manufacturing cost.

In the following, preferred embodiments of the present invention will be explained in more detail with reference to the figures.

Figure 1:
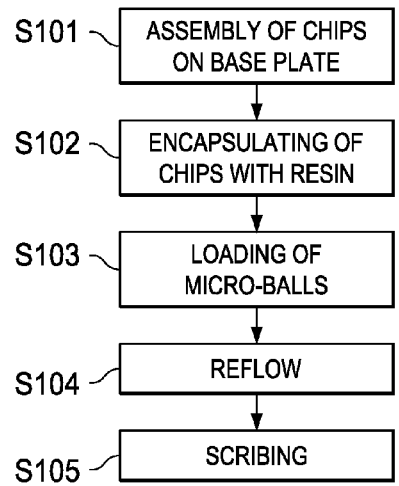
FIG. 1 is a schematic flow chart illustrating the operation of manufacturing semiconductor devices in an application example of the present invention.

FIG. 1 is a schematic flow chart illustrating a preferred operation of manufacture the semiconductor device pertaining to an application example of the present invention. In this application example, a BGA package is taken as an example of the semiconductor device for surface mounting. First, plural semiconductor chips are assembled on the substrate (step S101), and the assembled semiconductor chips are encapsulated with resin (step S102). Then the micro-balls are loaded on the terminal regions (electrode lands) of the substrate (step S103), metal connection between the micro-balls and the terminal regions is performed by means of reflow (step S104), and scribing is performed by cutting the substrate for each semiconductor chip (step S105).

Figure 2A:
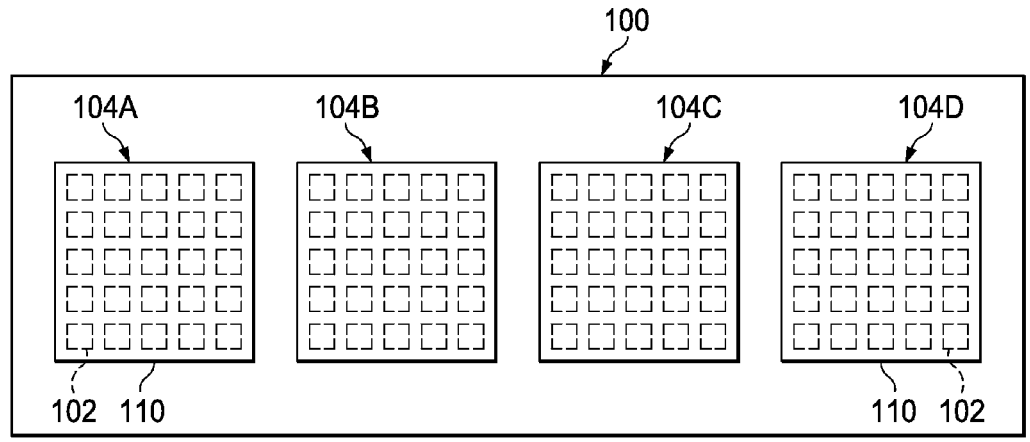
FIG. 2(a) is a plan view illustrating an example of a substrate with semiconductor chips assembled on it.
Figure 2B:
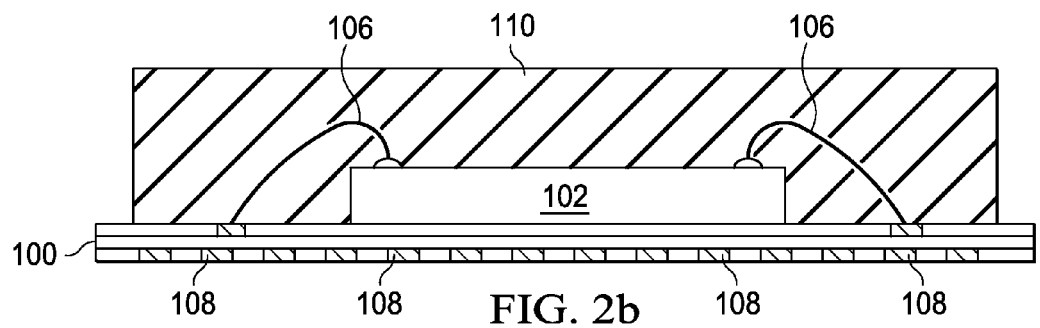
FIG. 2(b) is a cross section illustrating the case when one semiconductor chip is encapsulated on a substrate.

FIG. 2(a) is a plan view illustrating the substrate with semiconductor chips assembled on it. FIG. 2(b) is a cross section illustrating one semiconductor chip assembled on the substrate. Substrate (100) is not limited to this constitution. A multi-layer wiring substrate prepared by laminating insulating layers and wiring layers or a film substrate can also be used. With regard to the outer shape of substrate (100), it has a length of about 230 mm and a width of about 62 mm, for example. Semiconductor chips (102) are assembled on the surface of substrate (100) in a two-dimensional array configuration. For example, each 5×5 group of semiconductor chips is taken as a block (104A), and the blocks (104B), (104C), (104D) are arranged in the longitudinal direction of substrate (100).

As shown in FIG. 2(b), a semiconductor chip (102) is bonded to substrate (100) using die attach or another adhesive, and the electrodes formed on the surface of semiconductor chips (102) are connected to the wiring pattern on substrate (100) by means of bonding wires (106). As another scheme, semiconductor chips (102) may be assembled by flip chip assembly with the bump electrodes formed on its surface connected to the wiring pattern of a face-down substrate. The wiring pattern formed on the surface of substrate (100) is electrically connected to plural terminal regions (108) (the solid ink portions in the figure) formed in array configuration on the inner surface of substrate (100) via internal wiring. As will be explained later, terminal regions (108) provide regions for connection of micro-balls for external connection terminals of the BGA package. For example, it is possible to connect tens to hundreds of micro-balls for each BGA package.

Also, individual semiconductor chips (102) on substrate (100) are encapsulated with resin (110). In this application example, each block consisting of 5×5 semiconductor chips are encapsulated in it's entirely as a block. However, it is also possible to encapsulate each semiconductor chip (102) individually. The height of resin (110) from the surface of substrate (100) is about 450 µm, and the thickness of substrate (100) is about 240 µm for example.

Figure 3:
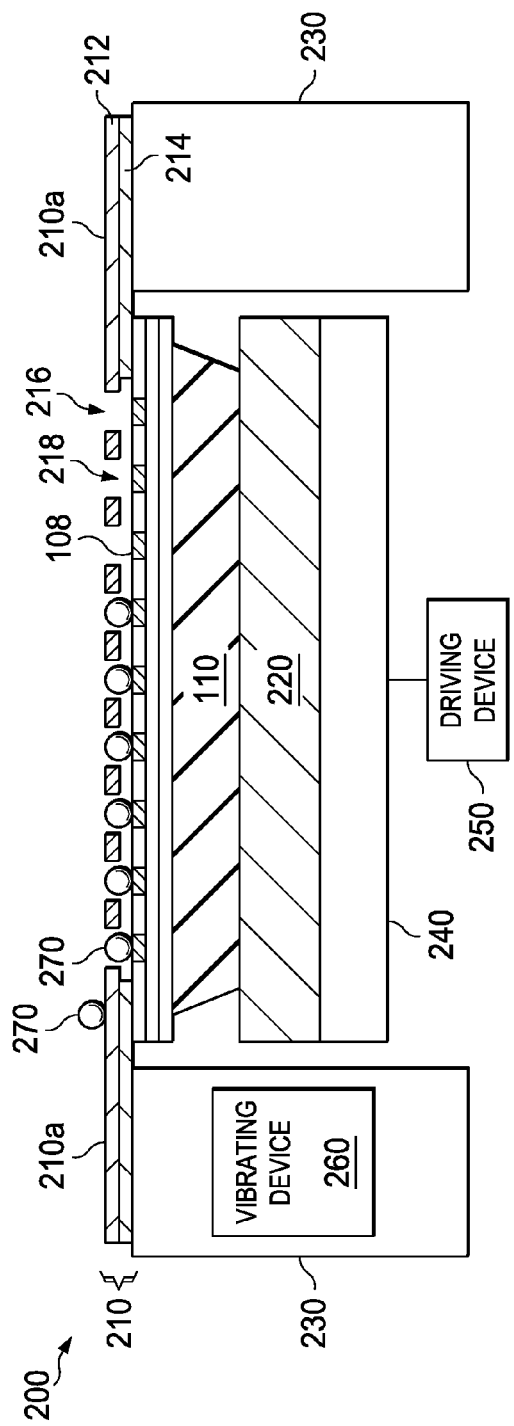
FIG. 3 is a schematic cross section illustrating the constitution of the micro-ball loading device in an application example of the present invention.

In the following, the micro-ball loading device will be explained. FIG. 3 is a schematic cross section illustrating the micro-ball loading device. Here, a substrate loading one semiconductor chip and a transfer mask are shown as an example. The micro-ball loading device shown in the figure may not be at the same scale as a practical one.

The micro-ball loading device (200) has the following parts: transfer mask (210) having plural through-holes formed in the same pattern as that of plural terminal regions (108) of substrate (100), backing plate (220) loaded with the encapsulating resin surface of substrate (100), fixing block (230) that is arranged around backing plate (220) and that has end portion (210a) of transfer mask (210) attached to it by means of a vacuum or the like, magnet part (240), which is arranged on the lower side of backing plate (220) and which attracts transfer mask (210) by magnetic force, driving device (250) that moves backing plate (220) and magnet part (240) in the vertical direction, and vibrating device (260) that applies vibration to end portion (210a) of transfer mask (210) attached on the fixing block (230).

Figure 4:
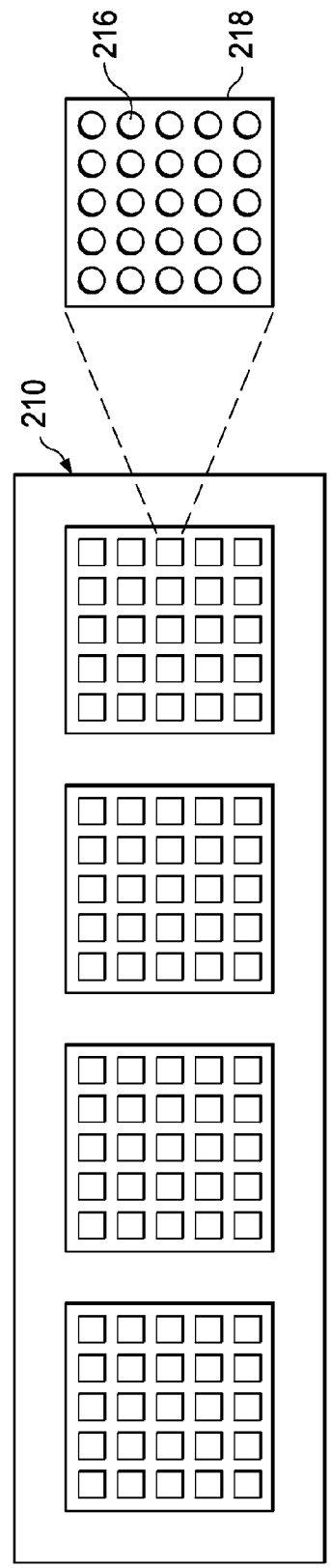
FIG. 4 is a plan view of the transfer mask.

FIG. 4 is an enlarged plan view of the transfer mask that shows the region of the mask corresponding to one semiconductor chip in an enlarged view. Through-holes (216) are formed in transfer mask (210) in the regions corresponding to blocks (104A)-(104D) of substrate (100). As shown in FIG. 3, transfer mask (210) has two aligned mask layers. First-layer mask (212) is made of stainless steel or another metal, with through-holes (216) formed in this metal mask. Second-layer mask (214) is made of acrylic resin, epoxy resin or another resin layer. Here, rectangular opening (218) is formed corresponding to the terminal region formed on the one semiconductor chip. In the example shown in FIG. 4, 5×5 through-holes (216) are formed in first-layer mask (212) corresponding to the terminal regions (5×5) formed on the substrate of one semiconductor chip, and rectangular opening (218) containing the regions of 5×5 through-holes (216) is formed in second-layer mask (214).

The end portion (210a) that forms the outer periphery of transfer mask (210) is fixed by fixing block (230), and the central portion of transfer mask (210) can be bent in the vertical direction with end portion (210a) held by the fixing block. As will be explained later, when the micro-balls are loaded, the composite transfer mask (210) is attached on the side of backing plate (220) by the magnetic force of magnet part (240), and transfer mask (210) is in close contact with the micro-ball loading surface of substrate (100).

Figure 5A:
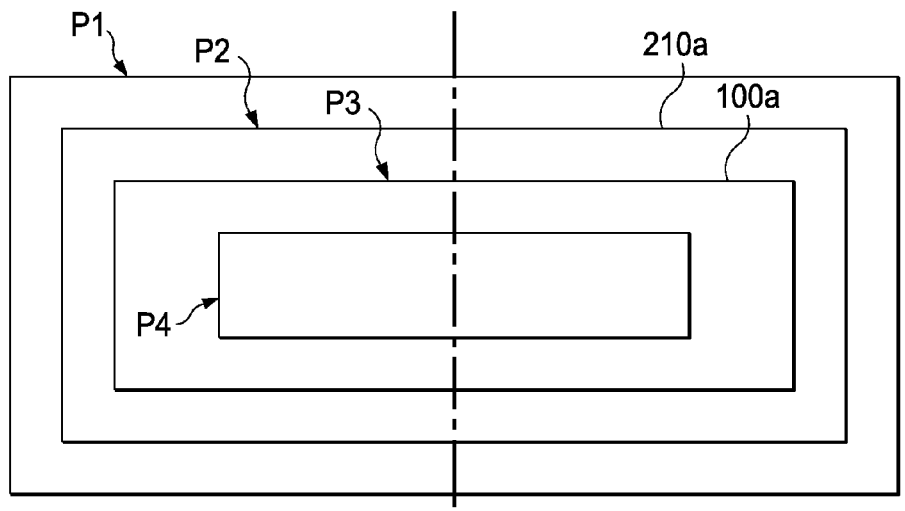
FIG. 5(a) is a diagram illustrating the sizes of the transfer mask, substrate, and magnet part as projected on a plane on the vertical direction.
Figure 5B:
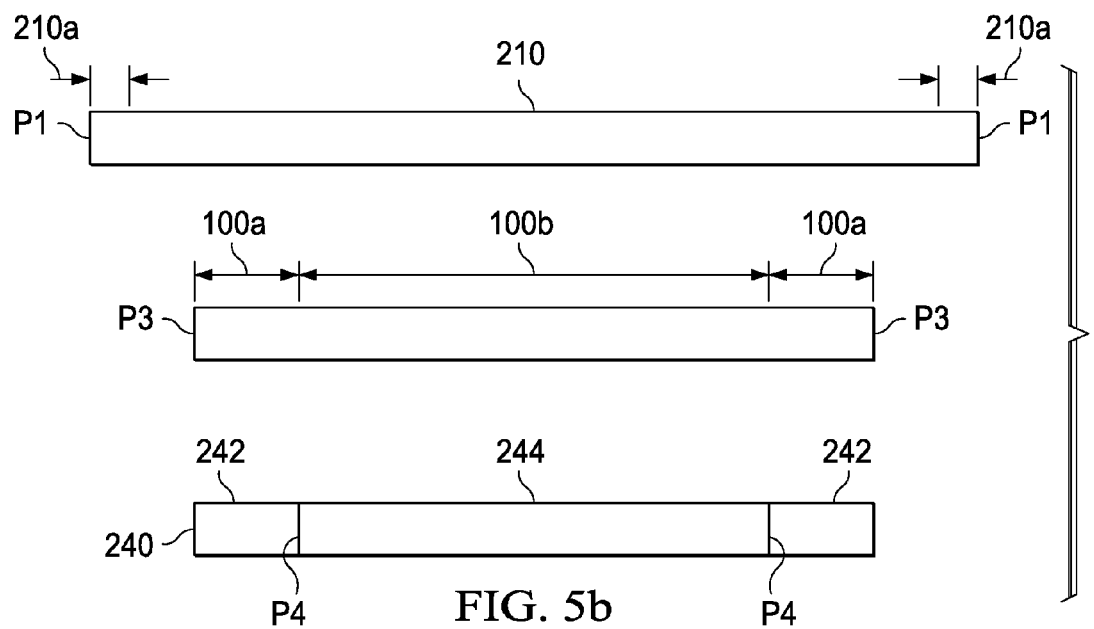
FIG. 5(b) is a schematic diagram illustrating the side surface of the sizes.
Figure 9A:
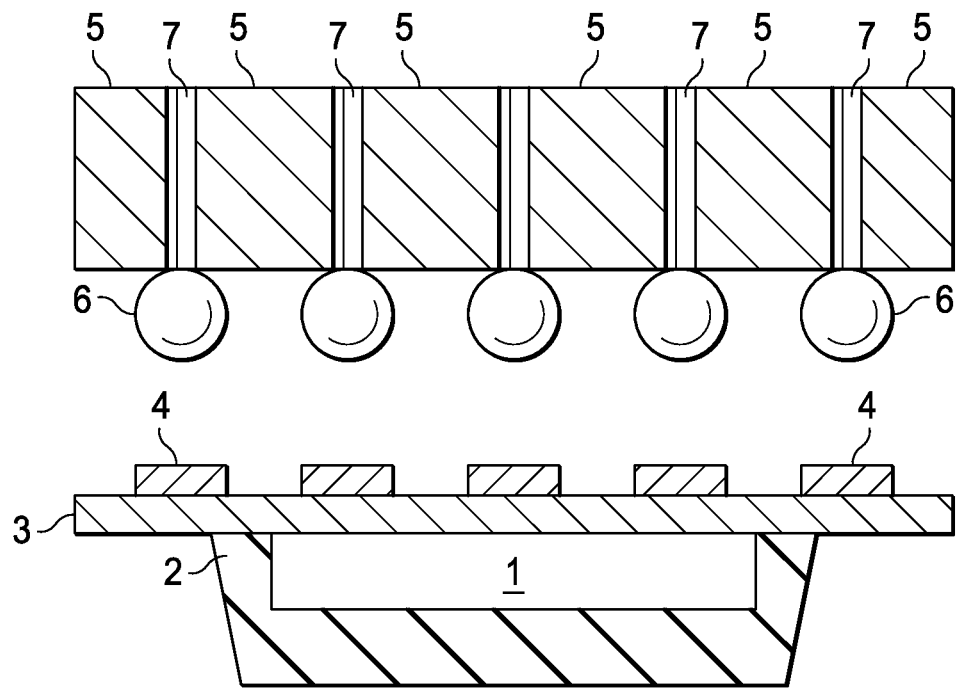
FIG. 9(a) is a diagram illustrating the method of loading by means of a suction holding head.
Figure 9B:
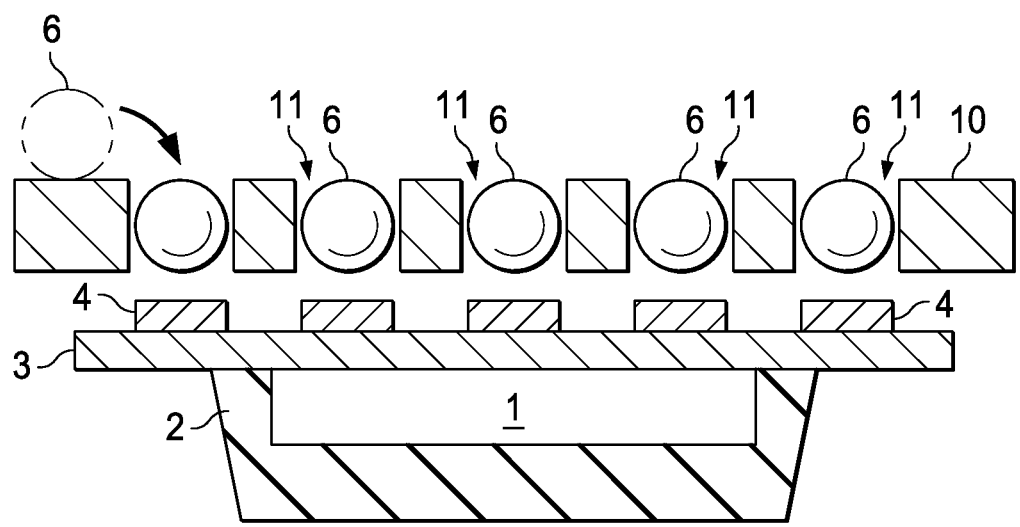
FIG. 9(b) is a diagram illustrating the method of loading using a transfer mask.
Figure 10A:
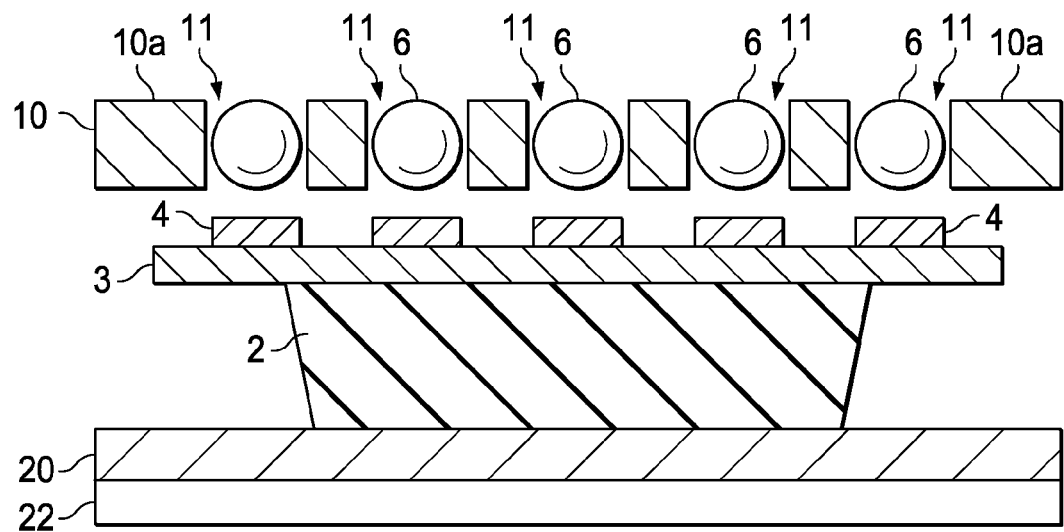
FIG. 10 is a diagram illustrating the problems with the transfer mask in the prior art.
Figure 10B:
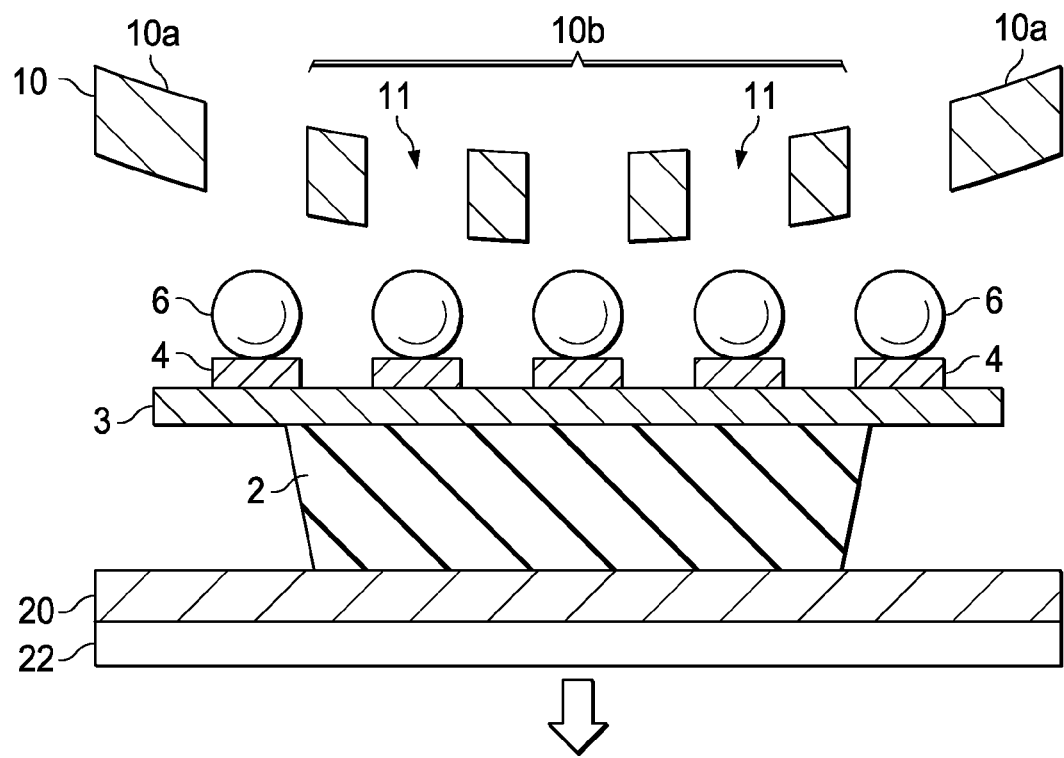

In this application example, magnet part (240) contains two permanent magnets with different magnetic forces. FIG. 5(a) depicts the transfer mask, substrate, and magnet part viewed in the vertical direction. FIG. 5(b) is a schematic side view of these parts. As shown in the figure, P1 represents the edge (outer edge) of transfer mask (210); P2 represents the boundary of end portion (210a) of transfer mask (210) where fixing block (230) is fixed; P3 represents the edge of substrate (100) and the edge of magnet part (240); and P4 represents the boundary of the region at the center of magnet part (240) with relatively weak magnetic force.

For transfer mask (210), end portion (210a), shown from edge P1 to the boundary P2, is fixed on fixing block (230). When substrate (100) is loaded on backing plate (220), substrate (100) is arranged symmetrically with respect to central line C of transfer mask (210). The magnet part (240) has nearly the same planar size as substrate (100). It has magnet region (242) with relatively high magnetic force corresponding to peripheral region (100a) of substrate (100), and magnet region (244) with relatively low magnetic force corresponding to inner region (100b) inside of the peripheral region (100a) of the substrate (100).

In the following, the operation of the micro-ball loading device will be explained. First, as shown in FIG. 6, backing plate (220) and magnet part (240) are lowered to the prescribed positions by means of driving device (250), and the encapsulating resin surface is supported by backing plate (220) such that the micro-ball loading surface (the surface where terminal regions (108) are formed) of substrate (100) faces upward. On the other hand, end portion (210a) of transfer mask (210) is fixed on fixing block (230).

Driving device (250) then drives backing plate (220) and magnet part (240) up to a prescribed positions. For example, backing plate (220) is raised so that the micro-ball loading surface of the substrate reaches the position where it contacts second-layer mask (214) of transfer mask (210). As a result, magnetic force of magnet part (240) pulls transfer mask (210) toward the side of the backing plate, and transfer mask (210) presses against the micro-ball loading surface of the substrate. In case of warping of substrate (100), transfer mask (210) pressure can correct this warping of the substrate.

Then, as shown in FIG. 3, micro-balls (270) are fed onto the surface of transfer mask (210). For example, micro-balls (270) are metal balls having a solder layer on the surface of a core made of copper or another metal or resin. Their diameter may be 300 µm, 180 µm, or about 100 µm for fine pitch substrates. The diameter of through-holes (216) is larger than the diameter of micro-balls (270) by about 10-20 µm. Here it is preferred that the thickness of transfer mask (210) be about 1.1-times that of micro-balls (270). Also, from the standpoint of preventing lateral deviation of the micro-balls, the thickness of resin layer (214) of transfer mask (210) should be about ⅓ the size of micro-balls (270). For example, assuming the diameter of micro-balls (270) to be 180 µm, the thickness of metal mask (212) is about 140 µm, the thickness of resin layer (140) is 60 µm, and the thickness of transfer mask (210) is about 200 µm.

The supplied micro-balls (270) fall into through-holes (216), and micro-balls (270) are loaded onto terminal regions (108) of substrate (100). It is preferred that flux or solder paste is formed in terminal regions (108) and micro-balls (270) are attached.

After loading of micro-balls (270) ends, driving device (250) drives backing plate (220) and magnet part (240) to descend. After descending, a magnetic force acts on transfer mask (210) due to magnet part (240). However, the magnetic force of magnet region (244) in the central portion of magnet part (240) is lower than that of magnet region (242) in its peripheral portion, so that the magnetic force acting on the central portion of transfer mask (210) is smaller relative to that of the peripheral edge portion, and bending of the central portion of transfer mask (210) is prevented. As a result, interference of through-holes (216) of transfer mask (210) with micro-balls (270) can be prevented, and no deviation in the position of the micro-balls takes place.

In addition, in order to load the micro-balls reliably in this application example, driving device (250) stops the backing plate (220) when it has descended by a prescribed distance. In this state, vibration is applied to transfer mask (210) by vibrating device (260). The vibration is preferably a vibration in the horizontal direction. Also, the vibration can be as short as one cycle. The vibration can be applied using a well-known means. For example, the following scheme may be adopted: a cam is driven to rotate by a motor, and the cam surface and the side surface of the transfer mask slide against each other so that vibration or impact can be applied to the transfer mask in the horizontal direction.

When the substrate is released from the transfer mask, because through-holes (216) are highly precise, micro-balls (270) may contact the interior of through-holes (216) of transfer mask (210) and may remain there, as shown in FIG. 7(a). According to the present application example, by applying vibration to transfer mask (210), micro-balls (270) left in through-holes (216) become detached from through-holes (216), and fall onto terminal regions (108), as shown in FIG. 7(b).

The position at which backing plate (220) is stopped is preferably at a distance of about the thickness of transfer mask (210). This is because the micro-balls falling from through-holes (216) might not be loaded onto terminal regions (108) correctly if the spacing between transfer mask (210) and the micro-ball loading surface becomes too large. In addition, the movement distance of transfer mask (210) in the horizontal direction due to vibration, for example, should be ½ the diameter of the micro-balls or less. This is because micro-balls (270) cannot be loaded correctly on terminal regions (108) if the movement distance is too large.

After the aforementioned operation, the substrate carrying the micro-balls is removed from the loading position, and it then undergoes the reflow operation, in which inter-metallic joining is performed between the solder layer formed on the surface of the micro-balls and terminal region (108). The substrate is then cut by a blade to form individual semiconductor chips, forming BGA packages that each have micro-balls (270) mounted on them.

In this way, according to the patent application, because the magnetic force acting on the transfer mask at the central portion is weaker than that acting at the peripheral edge portion, it is possible to prevent warping of the transfer mask when the substrate is released from the transfer mask, and it is possible to prevent deviation in position of the micro-balls caused by interference of the transfer mask. In addition, because vibration is applied to the transfer mask, it is possible to load the micro-balls remaining in the through-holes onto the terminal regions of the substrate more reliably and correctly.

In the following, examples of modified magnet part in the present application example will be explained. In the application example, two permanent magnets having different magnetic forces are used in order to adjust the transfer mask attachment force. However, a scheme can also be adopted in which a single permanent magnet is used to adjust the attachment force. As shown in FIG. 8(a), it is possible to adjust the thickness of permanent magnet (300) such that distance D1 to transfer mask (210) from magnet region (302) corresponding to peripheral region (100a) of substrate (100) is smaller than distance D2 to transfer mask (210) from magnet region (304) corresponding to interior region (100b) of substrate (100). As a result, the attachment by magnetic force of transfer mask (210) is stronger in the peripheral edge portion, and it is weaker in the central portion.

Also, as shown in FIG. 8(b), a scheme can be adopted in which the thickness of backing plate (222) positioned between permanent magnet (310) and transfer mask (210) is selected appropriately so that the thickness in region (224) corresponding to peripheral region (100a) of substrate (100) is smaller than the thickness in the region corresponding to interior region (100b) of the substrate. As a result, the attachment of transfer mask (210) by the magnetic force of permanent magnet (310) can be made higher in the peripheral edge portion, and lower in the central portion.

In the above, preferred embodiments of the present invention have been explained. However, the present invention is not limited to this. For example, various modifications and changes can also be adopted as long as the gist of the present invention is observed.

The different attachment forces created in the central portion and peripheral edge portion by the magnetic force of magnet part (240) can be adjusted appropriately according to the size, shape and rigidity of the transfer mask. In addition, they can also be changed appropriately according to the size and shape of the substrate and the arrangement of the terminal regions. According to the present invention, it is important to ensure that the transfer mask attachment force be lower in the central portion than in the peripheral edge portion.

In the above application example, a BGA package has been explained as an example. According to the present invention, however, it can also be adopted for CSP packages and other surface mounting type semiconductor devices. In the above application example, the transfer mask has a 2-layer structure consisting of a metal layer and a resist layer. However, the transfer mask can also have a single-layer structure, or a laminated structure having three or more layers.

The electroconductive ball loading device in the present invention may be used in semiconductor manufacturing equipment for manufacturing surface mounting type semiconductor devices.

What is claimed is:

1. A device for loading electro-conductive balls onto plural terminal regions on a substrate, comprising:
    a magnetic means, which exerts lower magnetic force at a center portion of a metal mask and a higher magnetic force at a peripheral portion of the metal mask.
2. The device of claim 1 further comprising:
    a vibrating means, which exerts a vibrating force on the metal mask with through-holes for passing the electro-conductive balls onto the substrate.

3. A device for loading electro-conductive balls onto plural terminal regions on a substrate, comprising:
- a carrying member that supports the substrate such that a surface of the substrate is free;
- a mask including a metal member and plural through-holes formed in the metal member corresponding to the plural terminal regions on the substrate;
- a fixing means that fixes end portions of the mask such that the mask faces the free surface of the substrate; and
- an attaching means, which is arranged on a side of the carrying member opposite to the side of the substrate, and which serves for attaching the mask on the carrying member by magnetic force, with an attachment force lower at a center portion of the substrate than at a peripheral portion of the substrate.

4. The loading device described in claim 3, in which the attaching means has a first magnet part corresponding to the peripheral portion of the substrate, and a second magnet part corresponding to the center portion of the substrate, and the magnetic force of the second magnet part is weaker than that of the first magnet part.

5. The attaching means in claim 3, further comprising a carrying member of varied thickness such that its thickness at the peripheral portion of the substrate is smaller than its thickness at the center portion of the substrate, and a magnet is arranged near the carrying member.

6. The loading device described in claim 3, further comprising a moving means that moves the carrying member towards and away from the mask.

7. The loading device described in claim 3, in which the substrate carries semiconductor chips and a resin for sealing the semiconductor chips on the surface.

8. A loading method for loading electro-conductive balls on plural terminal regions on a substrate, comprising the following process steps:
- arranging the substrate such that it is opposite to a mask having plural through-holes formed in it corresponding to the plural terminal regions on the substrate;
- pulling the mask against the substrate with a magnetic means that pulls a center portion of the mask less forcefully than it pulls a peripheral portion of the substrate;
- passing electro-conductive balls through the plural through-holes onto the terminal regions of the substrate; and
- vibrating the mask when the substrate is separated from the mask by a prescribed distance.

9. The loading method described in claim 8, in which the vibration consists of one cycle.

* * * * *